(12) United States Patent
Schafferer

(10) Patent No.: US 6,798,251 B1
(45) Date of Patent: Sep. 28, 2004

(54) DIFFERENTIAL CLOCK RECEIVER WITH ADJUSTABLE OUTPUT CROSSING POINT

(75) Inventor: Bernd Schafferer, Gloucester, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 10/217,681

(22) Filed: Aug. 13, 2002

(51) Int. Cl.[7] .............................................. G01R 19/00
(52) U.S. Cl. .......................... 327/52; 327/65; 327/71; 330/258; 330/261
(58) Field of Search ................................ 327/291, 293, 327/295, 296, 52, 55, 56, 65, 71, 359; 330/253, 258, 261

(56) References Cited

U.S. PATENT DOCUMENTS 5,182,467 A * 1/1993 Taylor et al. ............... 327/175
5,606,272 A * 2/1997 Behbahani et al. ........... 327/65
5,631,594 A * 5/1997 Kimura ...................... 327/351
5,726,588 A * 3/1998 Fiedler ......................... 326/63
6,073,002 A * 6/2000 Peterson ..................... 455/326

* cited by examiner

Primary Examiner—Timothy P. Callahan
Assistant Examiner—An T. Luu
(74) Attorney, Agent, or Firm—Gauthier & Connors, LLP

(57) ABSTRACT

Described is a differential clock receiver comprising a converter, a differential input stage, and a differential output stage. The converter converts a control signal indicative of a timing relationship into a DC offset signal. The differential input stage receives a differential clock signal and the DC offset signal. The differential input stage generates an intermediary differential signal from the differential clock. The intermediary differential signal has a DC offset resulting from the DC offset signal. The differential output stage receives the intermediary differential signal and generates at least two output signals from the intermediary differential signal. The output signals have a timing relationship determined by the DC offset of the intermediary differential signal.

12 Claims, 7 Drawing Sheets

DIFFERENTIAL CLOCK RECEIVER WITH ADJUSTABLE OUTPUT CROSSING POINT

BACKGROUND OF THE INVENTION

The invention relates to the field of clock receivers, and in particular to a differential clock receiver with adjustable output timing.

A number of applications employ clock receivers that receive a clock signal and produce output signals used for the timing of other circuitry. One such application is a differential current steering digital-to-analog converter (DAC). Generally, a differential current steering DAC is a device that converts a digital value into a differential current by steering an amount of current out one or the other output of a differential output pair depending on the value of each bit in the digital word. Current steering DACs steer current out one path or the other by using differential switches in which one transistor is turned off while the other is turned on so as to steer a common current along a particular path. For such differential switches, it is important to control the on/off timing relationship between the two transistors. The on/off timing relationship is controlled by on/off signals that control the state of the transistors such that when one is turning on, the other is turning off. The on/off signals are derived from driver signals generated by a clock generator. The clock generator derives the driver signals from output signals output by a clock receiver. The clock receiver receives a clock signal and generates the output signals from the clock signal. When using such differential switches in a differential current steering DAC or other device, it is important to control the on/off timing relationship between the two transistors. In this situation, a clock receiver whose outputs have an adjustable timing relationship would be advantageous.

SUMMARY OF THE INVENTION

In one aspect, the present invention provides a differential clock receiver comprising a converter, a differential input stage, and a differential output stage. The converter converts a control signal indicative of a timing relationship into a DC offset signal. The differential input stage receives a differential clock signal and the DC offset signal. The differential input stage generates an intermediary differential signal from the differential clock. The intermediary differential signal has a DC offset resulting from the DC offset signal. The differential output stage receives the intermediary differential signal and generates at least two output signals from the intermediary differential signal. The output signals have a timing relationship determined by the DC offset of the intermediary differential signal.

In another aspect, the present invention provides a method of generating output signals with an adjustable timing relationship in a differential clock receiver. A differential clock signal is received. A control signal indicative of a timing relationship is received. The control signal is converted into a DC offset signal. An intermediary differential signal is generated from the differential clock signal and the DC offset signal. The intermediary differential signal has a DC offset resulting from the DC offset signal. At least two output signals are generated from the intermediary differential signal. The output signals have a timing relationship determined by the DC offset of the intermediary differential signal.

DETAILED DESCRIPTION OF THE INVENTION

Figure 1:
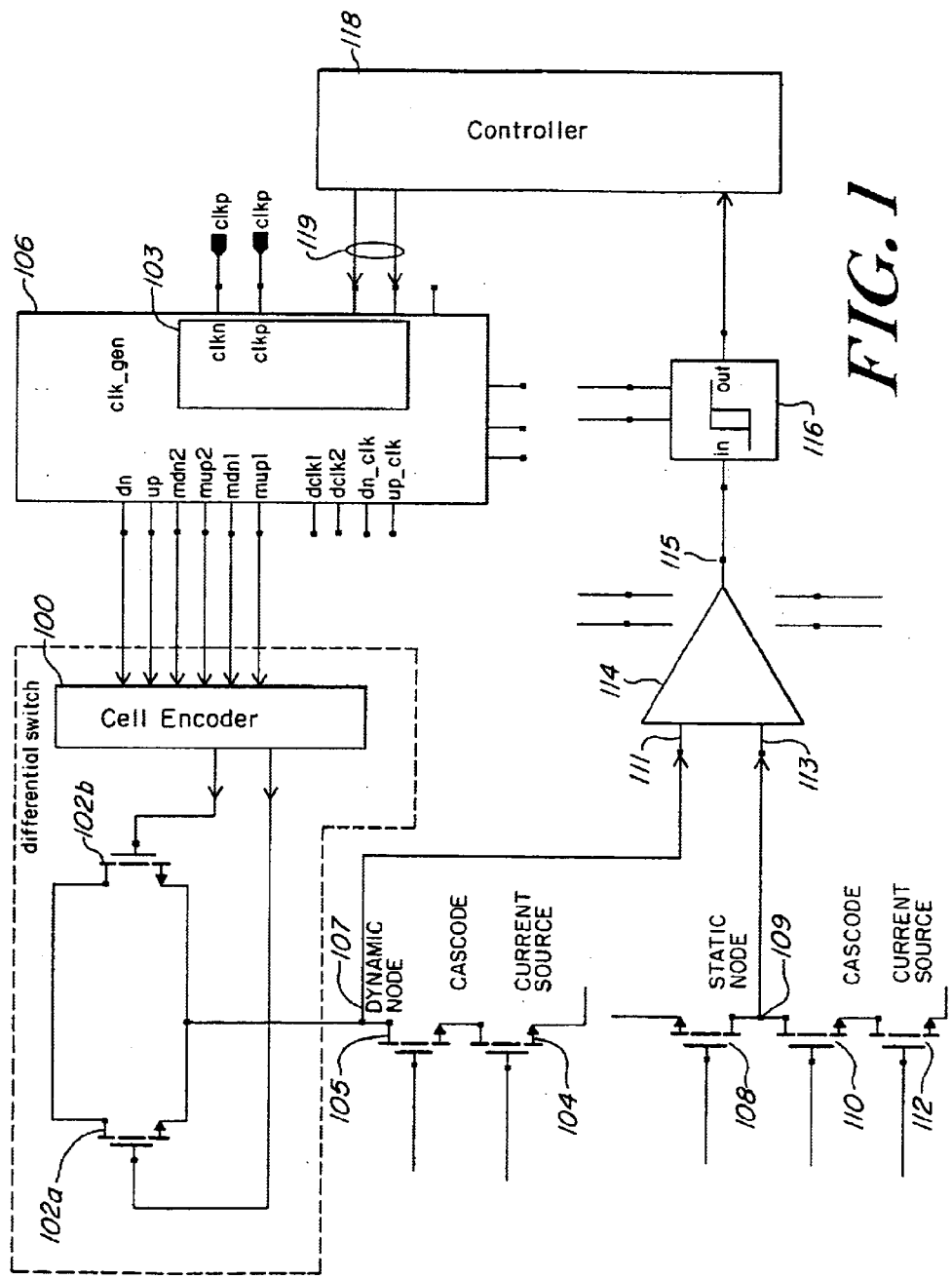
FIG. 1 illustrates a clock generator, incorporating a differential clock receiver according to the present invention, as used in one embodiment of a DAC control loop.

There is depicted in the drawings, and will herein be described in detail, a clock receiver according to the present invention as used in a control loop for a current steering DAC in accordance with the teachings the copending application entitled "Control Loop for Minimal Tailnode Excursion of Differential Switches,", Ser. No. 10/217,842, filed by common assignee on even date herewith, and incorporated herein by reference. The clock receiver receives a differential clock and generates at least two output signals from the differential clock. The clock receiver is part of a clock generator that uses the output signals to create driver signals. The driver signals are used to derive the on/off signals that control the transistors in the differential switches of the DAC. The timing relationship of the output signals, and consequently the driver signals, is adjustable based on a control signal input to the clock receiver. Via the control signal, the control loop adjusts the timing relationship of the driver signals such that the on/off signals do not overlap too much or too little.

While the clock receiver according to the principles of the present invention is described as part of a clock generator used in a switch driver timing control loop for a current steering DAC, the present disclosure is to be considered as an exemplification of the principles of the invention and the associated functional specifications for its construction. The present disclosure is not intended to limit the invention to the embodiment(s) or uses illustrated. Those skilled in the art will envision many other possible variations within the spirit and scope of the present invention.

FIG. 1 illustrates a clock generator 106, incorporating a differential clock receiver 103 according to the present invention, as used in one embodiment of a DAC control loop in accordance with the teachings of the copending application entitled "Control Loop for Minimal Tailnode Excursion of Differential Switches",filed by common assignee on even date herewith. As shown, transistors 102a and 102b form a differential current switch. The differential current switch is a replica of current switches located in a matrix of current switches used to steer current out one output or the other of the DAC. On/off signals are provided to the gates of transistors 102 by cell decoder 100. The on/off signals control the state of transistors 102 such that one transistor turns on while the other is turning off. The on/off signals from the driver signals, dn and up, supplied by clock generator 106. Clock generator 106 derives the driver signals from the output signals of clock receiver 103. Clock receiver 103 receives a differential clock as signals clkp and clkn, and uses the differential clock to generate the output signals.

Transistors 102 are connected at a tail node 107 to a cascoded current generator comprising a current source transistor 104 and cascode transistor 105. A DC reference is set up using transistor 108 and another cascoded current generator comprising transistors 110 and 112. The DC reference is taken at the node 109 and is equivalent to the value that node 107 would be when there is an appropriate amount of overlap between the on/off signals, i.e. when the overlap of the on/off signals is neither too big or too little.

Tail node 107 is compared to DC reference node 109 by comparator 114. A first input 111 of comparator 114 is connected to tail node 107, while a second input 113 of comparator 114 is connected to DC reference node 109. An output 115 of comparator 114 provides an overlap signal indicative of whether the average of tail node 107 is greater than or less than DC reference node 109. When the on/off signals are overlapping too much, the average of tail node 107 is greater than DC reference node 109. Conversely, when the on/off signals are not overlapping enough, the average of tail node 107 is less than DC reference node 109. The output of comparator 114 is provided to a controller 118. While not necessary, hysterisis 116 is preferably used to provide a "clean" digital signal to controller 118.

Based on output 115, controller 118 determines whether the on/off signals should be overlapped more or less. Controller 118 sends a control signal to clock generator 106 that results in an adjustment of the timing relationship of the driver signals, dn and up, which are used by cell decoder 100 to derive the on/off signals. In the embodiment shown, the control signal comprises two digital words, dn_del and up_del. These control signals are received by clock receiver 103 and cause the timing relationship of the clock receiver's output signals to be adjusted accordingly. This, in turn, causes the tiring relationship of the driver signals to be adjusted, resulting in an adjustment of the timing relationship of the on/off signals.

The control signal causes the timing to be adjusted such that there is more overlap when more overlap is needed. Conversely, the control signal causes the timing to be adjusted such that there is less overlap when less overlap is needed. After a preset settling period following the clock receiver's adjustment of the timing, controller 118 again determines from output 115 whether the on/off signals should be overlapped more or less, and adjusts the control signal again as appropriate. This cycle is continued until an optimal point is reached.

Figure 2:
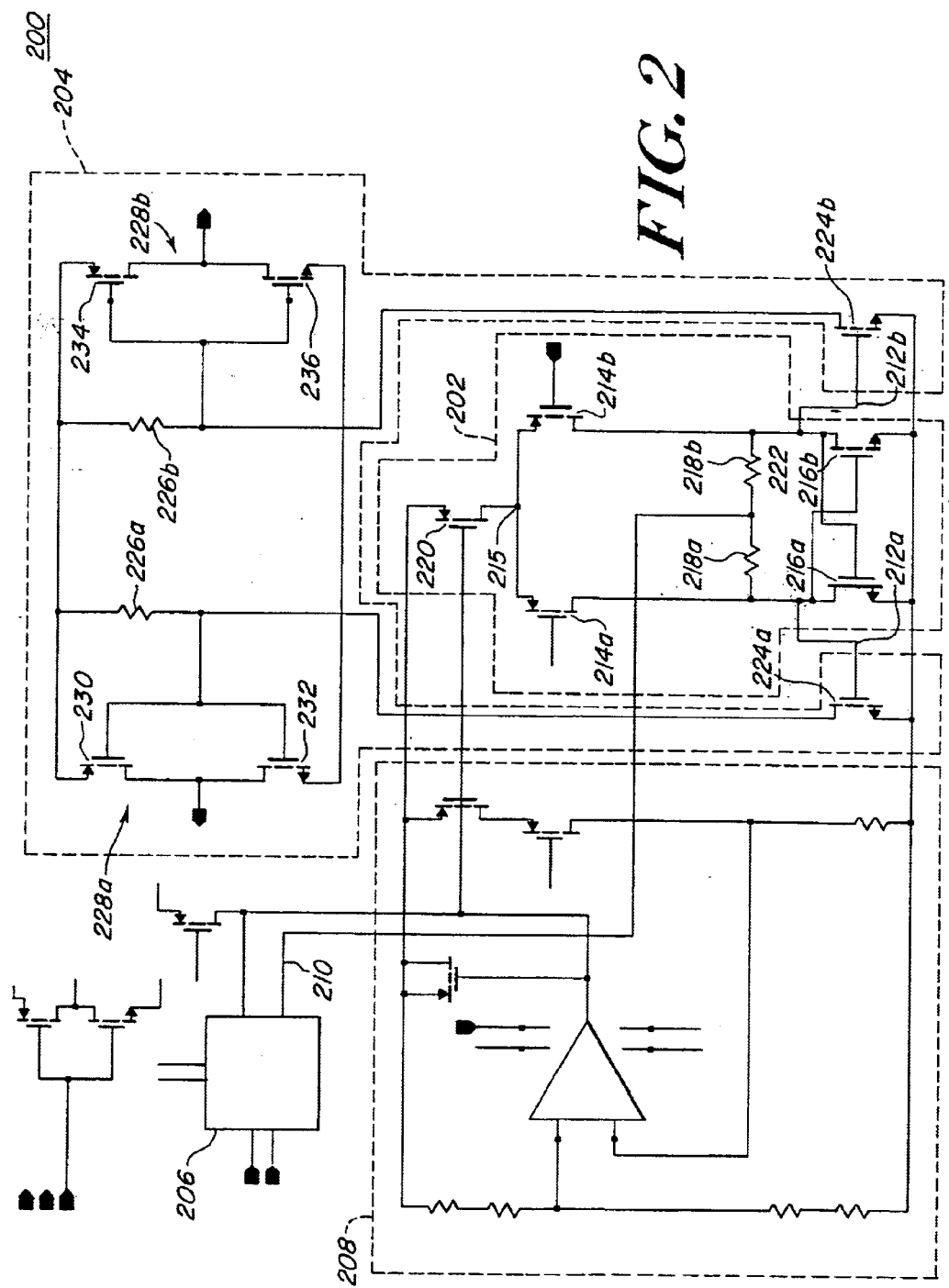
FIG. 2 illustrates a clock receiver according to the principles of the present invention.

FIG. 2 illustrates a clock receiver 200 according to the principles of the present invention. Generally, differential clock receiver 200 comprises a differential input stage 202, a differential output stage 204, and a converter 206. Converter 206 converts the control signal, which is indicative of the desired timing relationship, into a DC offset signal. In the embodiment shown, the control signal comprises two digital words, dn_del and up_del, which converter 206 receives and converts into a DC offset signal 210. Differential input stage 202 receives a differential clock (as signals clkp and clkn) and DC offset signal 210. Differential input stage 202 generates an intermediary differential signal 212 (as signals 212a and 212b) from the differential clock. Intermediary differential signal 212 has a DC offset resulting from DC offset signal 210. Differential output stage 204 receives intermediary differential signal 212 and generates at least two output signals (outn and outp) from intermediary differential signal 212. The output signals have a timing relationship determined by the DC offset of intermediary differential signal 212. As described, when clock receiver 200 is used with clock generator 106, the output signals are used by clock generator 106 to derive driver signals, up and dn.

In the embodiment shown, differential input stage 202 comprises a differential transistor pair 214a and 214b with a cross-coupled load 216a and 216b that is resistively degenerated by resistors 218a and 218b. Transistor 214a receives clockp on its gate, while transistor 214b receive clockn on its gate. Transistors 214a and 214b are connected at a tail node 215 to a current source comprised of transistor 220. The DC offset signal is a DC current received at node 222 in between resistors 218a and 218b. Using node 222 to inject a DC offset current produces minor affects on the AC performance of clock receiver 200 because node 222 has a very low voltage swing due to the differential nature of the signals. This allows the timing of the output signals to be adjustable over a wide range while the AC performance is kept relatively unchanged.

The differential output nodes n1 and n2 are connected to transistor pair 224a and 224b in the differential output stage. Transistor 224a forms a current mirror with transistor 216b, while transistor 224b forms a current mirror with transistor 216a. A resistive load 226a is connected to input transistor 224a to generate a voltage at node n3 that is proportional to the current in input transistor 224a. Similarly, a resistive load 226b is connected to input transistor 224b to generate a voltage at node n4 that is proportional to the current in input transistor 224b. An inverter 228a formed from transistors 230 and 232 receives the voltage at n3 and generates the output signal outn. Likewise, an inverter 228b formed from transistors 234 and 236 receives the voltage at n4 and generates the output signal outp.

The DC current injected at node 222 causes a corresponding offset current to be mirrored in transistors 224a and 224b, which results in a corresponding DC offset voltage at nodes n3 and n4. Adjusting the DC offset voltage adjusts the switching timing of inverters 228a and 228b, which results in the timing relationship between outp and outn being adjusted.

Also in the embodiment shown, clock receiver comprises a DC bias circuit 208. DC bias circuit 208 maintains the bias of current source 220 such that the voltages at nodes n3 and n4, ideally, sit at half the supply voltage when there is no input signal to differential transistor pair 214a and 214b. In practice, DC bias circuit 208 maintains differential input stage 202 in a balanced state, such that any hysterisis is centered on half the supply voltage.

Figure 3:
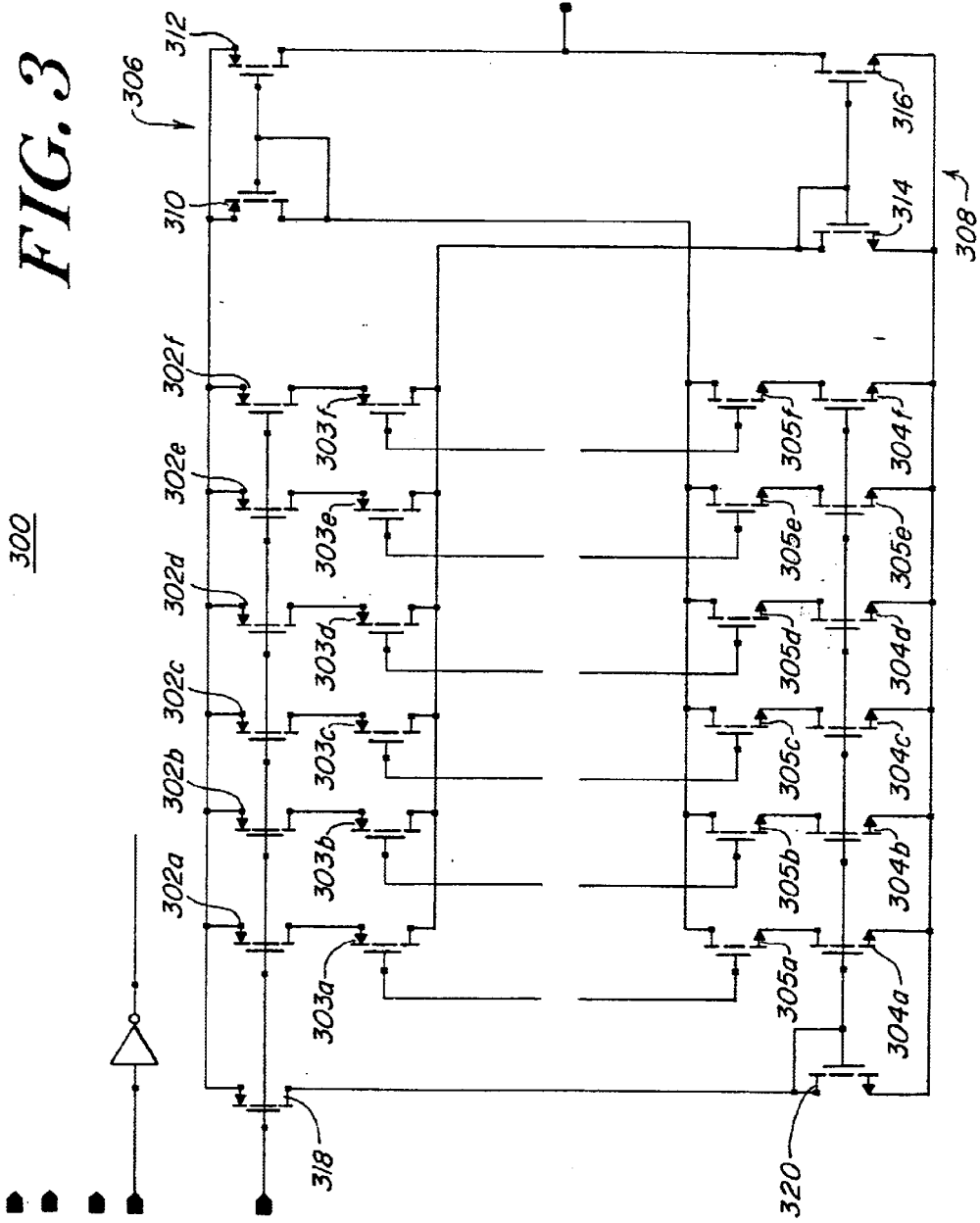
FIG. 3 illustrates one embodiment for a converter of the clock receiver according to the principles of the present invention.

FIG. 3 illustrates one embodiment of converter 206. A first set of current sources 302a–e are each serially connected to a corresponding switch 303a–e. Current sources 302a–e are biased to source current to a first current mirror 308 when the corresponding switch 303a–e is enabled. Switches 303a–e are enabled based on a bit in a first one of the two digital words, i.e. dn_del. The bits in dn_del are inverted prior to applying them to switches 303a–e.

The current sourced to first current mirror 308 passes through transistor 314. Transistor 316 mirrors this current, consequently sinking current from the output, Iout, to form the DC offset signal.

A second set of current sources 304a–e are each serially connected to a corresponding switch 305a–e. Current sources 304a–e are biased to sink current from a second current mirror 306 when the corresponding switch 305a–e is enabled. Switches 305a–e are enabled based on a bit in a second one of the two digital words, i.e. up_del.

The current sunk from second current mirror 306 passes through transistor 310. Transistor 312 mirrors this current, consequently sourcing current to the output, Iout, to form the DC offset signal.

Current mirrors 306 and 308 are used to decrease the output capacitance. For the particular implementation shown, the output current range is approximately half of the current from current source 220 and follows the following function:

$$i_{out} = i_{tail}/2*(\text{up\_delay}/64 - \text{dn\_delay}/64)$$

where $i_{out}$ is the output current (DC offset current) and $i_{tail}$ is the current from current source 220. This output range, however, will generally be a matter of design choice that depends upon the particular implementation.

Transistor 318 generates a current that is equal to the total current available from sources 302. This current passes through transistor 320, which biases current sources 304 via a current mirror configuration, such that the total current available from current sources 304 equals the total current available from current sources 302.

Figure 4A:
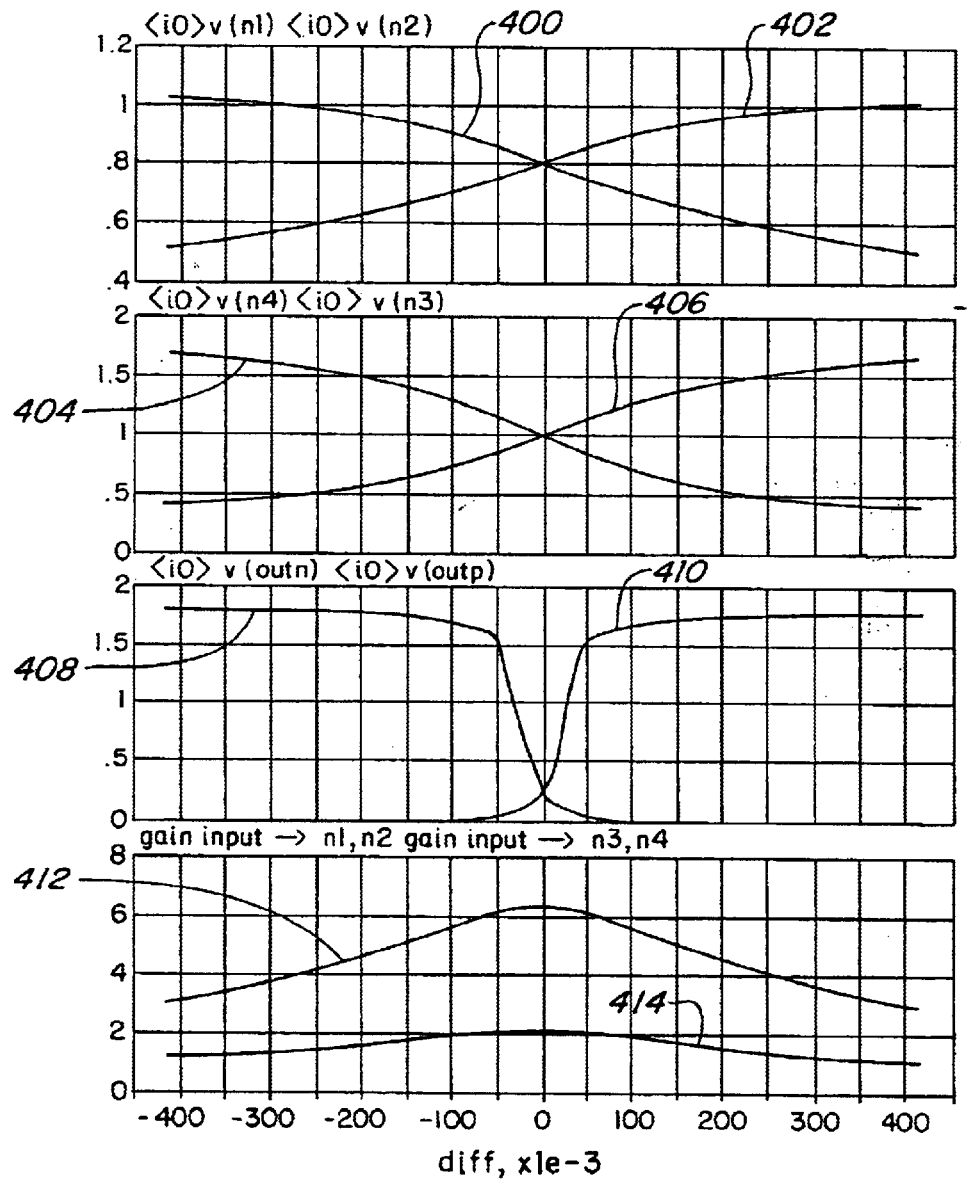
FIGS. 4a and 4b illustrate a DC analysis of the circuits shown in FIGS. 2 and 3 for dn_del=16 and up_del=16, respectively.
Figure 4B:
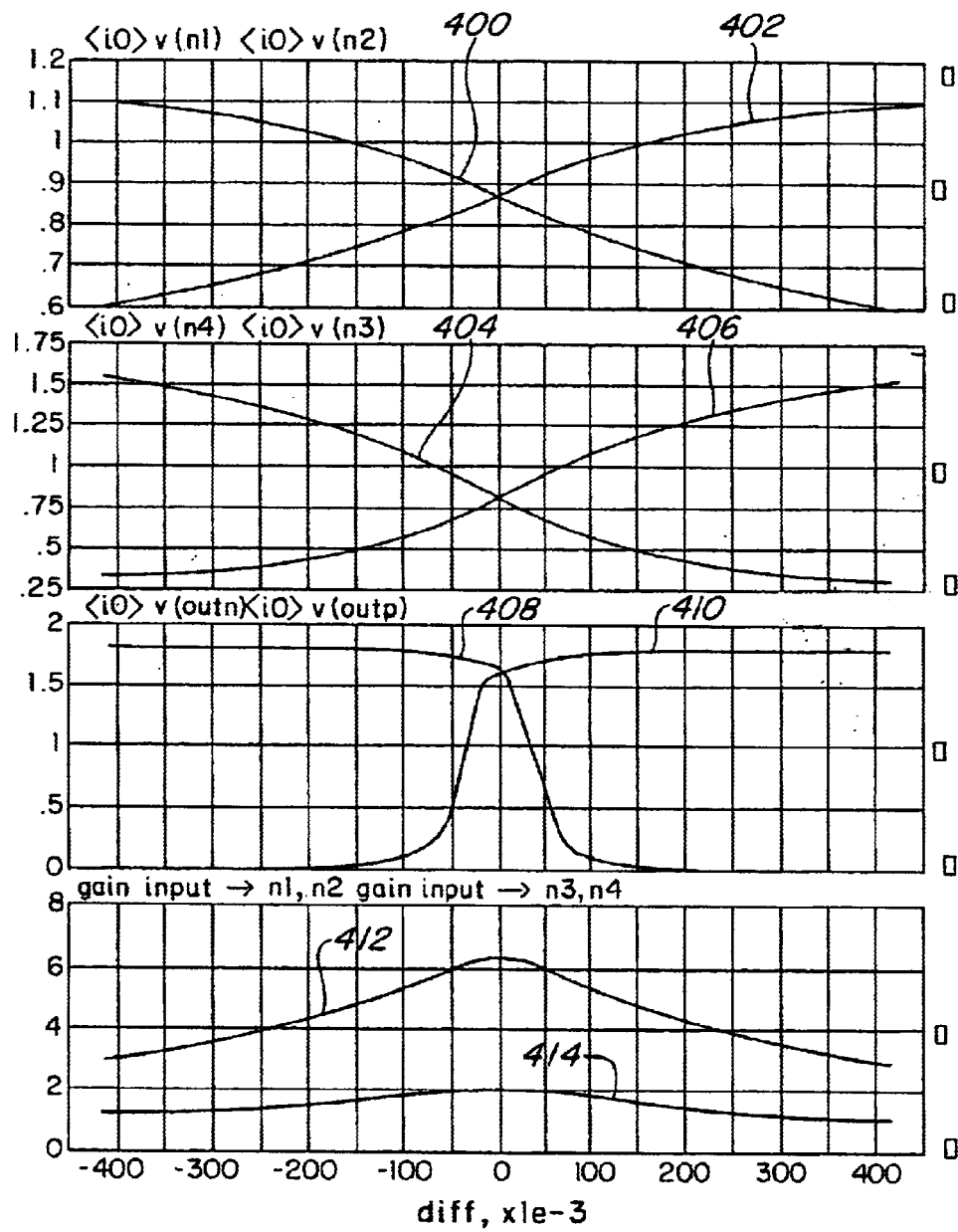

FIGS. 4*a* and 4*b* illustrate a DC analysis of the circuits shown in FIGS. 2 and 3 for dn_del=16 and up_del=16, respectively. Line 400 corresponds to the voltage at node n1, while 402 corresponds to the voltage at node n2. Line 404 corresponds to the voltage at node n4, while 406 corresponds to the voltage at node n3. Line 408 corresponds to outn, while 410 corresponds to outp. Line 412 corresponds to the gain for node n3, n4, while 414 corresponds to the gain for node n1, n2. As can be seen from FIGS. 4*a* and 4*b*, even though the DC offset current changed significantly (dn_delay=16 to up_delay=16), the gain remains relatively constant.

Figure 5A:
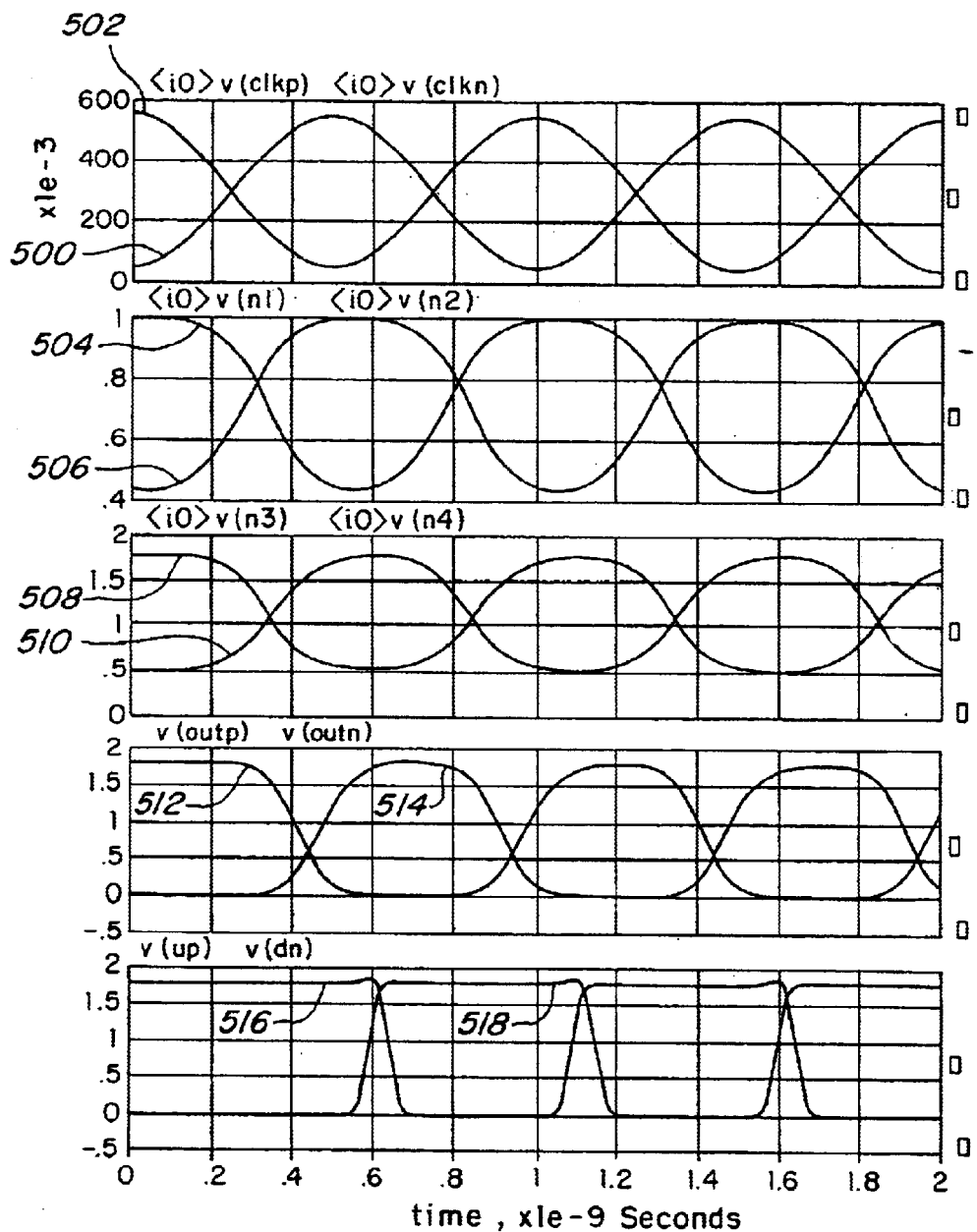
FIGS. 5a and 5b illustrate a transient analysis of the circuits shown in FIGS. 2 and 3 for dn_del=31 and up_del=31, respectively.
Figure 5B:
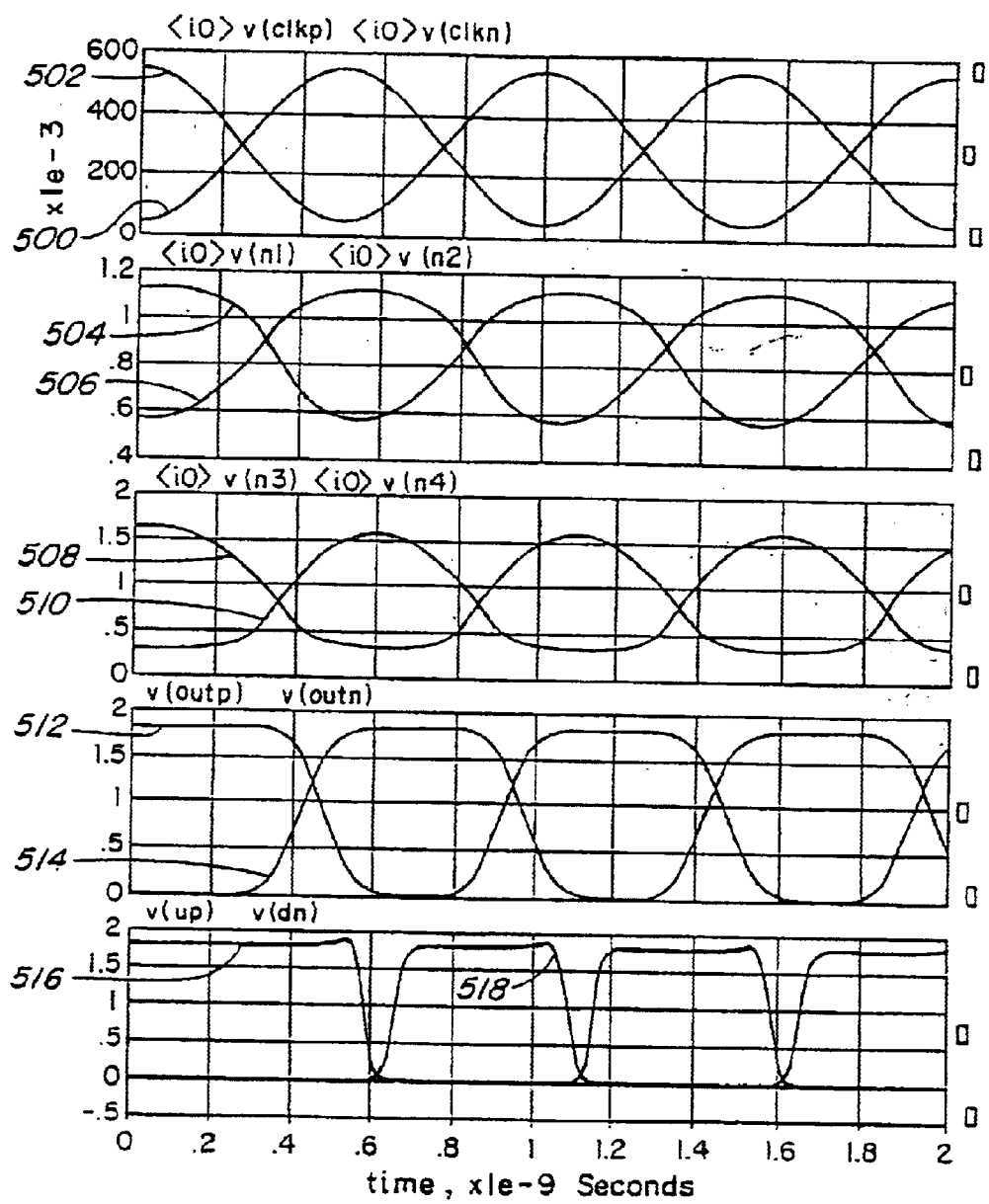

FIGS. 5*a* and 5*b* illustrate a transient analysis of the circuits shown in FIGS. 2 and 3 for dn_del=31 and up_del=31, respectively. Line 500 corresponds to clockp, while line 502 corresponds to clockn. Line 504 corresponds to the voltage at node n1, while 506 corresponds to the voltage at node n2. Line 508 corresponds to the voltage at node n4, while 510 corresponds to the voltage at node n3. Line 512 corresponds to outn, while 514 corresponds to outp. Line 516 corresponds to the driver signal dn when the clock receiver is used as part of clock generator 106, while 518 corresponds to the driver signal up.

Although the present invention has been shown and described with respect to several preferred embodiments thereof, various changes, omissions and additions to the form and detail thereof, may be made therein, without departing from the spirit and scope of the invention.

What is claimed is:

1. A differential clock receiver comprising:
   a converter to convert a control signal indicative of a timing relationship into a DC offset signal;
   a differential input stage to receive a differential clock signal and the DC offset signal, the differential input stage generating an intermediary differential signal from the differential clock signal and DC offset signal, the intermediary differential signal having a DC offset resulting from the DC offset signal;
   a differential output stage to receive the intermediary differential signal and generate at least two output signals from the intermediary differential signal, the output signals having a first crossing point with a first amplitude when said DC offset is zero, the output signals having a second crossing point with a second amplitude when said DC offset is non-zero, said first amplitude of said first crossing point being different from said second amplitude of said second crossing point.

2. A differential clock receiver comprising:
   a converter to convert a control signal indicative of a timing relationship into a DC offset signal;
   a differential input stage to receive a differential clock signal and the DC offset signal, the differential input stage generating an intermediary differential signal from the differential clock signal and DC offset signal, the intermediary differential signal having a DC offset resulting from the DC offset signal;
   a differential output stage to receive the intermediary differential signal and generate at least two output signals from the intermediary differential signal, the output signals having a timing relationship determined by the DC offset of the intermediary differential signal;
   said differential input stage including,
      a differential transistor pair to receive the differential clock, the differential transistor pair connected at a tail node to a current source, and
      a cross-coupled load connected to the differential transistor pair, the cross coupled load resistively degenerated by a pair of resistors;
   said DC offset signal being a DC current received at a node in-between the pair of resistors.

3. The receiver according to claim 2, wherein the differential output stage comprises:
   a transistor pair coupled to the output of the differential input stage such that the first input transistor of the input pair forms a first current mirror with a first transistor of the cross coupled load and the second input transistor of the input pair forms a second current mirror with a second transistor of the cross-coupled load;
   a first resistive load connected to the first input transistor to generate a voltage proportional to the current in the first input transistor;
   a second resistive load connected to the second input transistor to generate a voltage proportional to the current in the second input transistor;
   a first inverter to receive the voltage proportional to the current in the first input transistor and to generate one of the at least two output signals from the received voltage; and
   a second inverter to receive the voltage proportional to the current in the second input transistor and to generate one of the at least two output signals from the received voltage.

4. The receiver according to claim 3, wherein:
   the control signal comprises two digital words; and
   the converter comprises:
      a first set of current sources, each current source serially connected to a corresponding switch and sourcing current to a first current mirror when the corresponding switch is enabled; wherein the switch is enabled based on a bit in a first one of the two digital words;
      a second set of current sources, each current source serially connected to a corresponding switch and sinking current from a second current mirror when the corresponding switch is enabled; wherein the switch is enabled based on a bit in a second one of the two digital words;
      wherein the first current mirror sources current to an output of the converter to form the DC offset signal; and
      wherein the second current mirror sinks current from an output of the converter to form the DC offset signal.

5. The receiver according to claim 4, further comprising:
   a DC bias circuit to bias the current source such that the voltage proportional to the current in the first input transistor and the voltage proportional to the current in the second input transistor are equal to half of a supply voltage when there is no differential clock input.

6. A differential clock receiver comprising:

a converter to convert a control signal indicative of a timing relationship into a DC offset signal;

a differential input stage to receive a differential clock signal and the DC offset signal, the differential input stage generating an intermediary differential signal from the differential clock signal and DC offset signal, the intermediary differential signal having a DC offset resulting from the DC offset signal;

a differential output stage to receive the intermediary differential signal and generate at least two output signals from the intermediary differential signal, the output signals having a timing relationship determined by the DC offset of the intermediary differential signal;

said control signal being two digital words;

said converter including, a first set of current sources, each current source serially connected to a corresponding switch and sourcing current to a first current mirror when the corresponding switch is enabled; wherein the switch is enabled based on a bit in a first one of the two digital words, and a second set of current sources, each current source serially connected to a corresponding switch and sinking current from a second current mirror when the corresponding switch is enabled; wherein the switch is enabled based on a bit in a second one of the two digital words;

said first current mirror sourcing current to an output of the converter to form the DC offset signal;

said second current mirror sinking current from an output of the converter to form the DC offset signal.

7. The receiver according to claim 1 used in a control loop for a current steering DAC.

8. In a differential clock receiver, a method of generating output signals with an adjustable timing relationship, the method comprising:

receiving a differential clock signal;

receiving a control signal indicative of a timing relationship;

converting the control signal into a DC offset signal;

generating an intermediary differential signal from the differential clock signal and the DC offset signal, the intermediary differential signal having a DC offset resulting from the DC offset signal;

generating at least two output signals from the intermediary differential signal, the output signals having a first crossing point with a first amplitude when the DC offset is zero, the output signals having a second crossing point with a second amplitude when the DC offset is non-zero, the first amplitude of the first crossing point being different from the second amplitude of the second crossing point.

9. The differential clock receiver according to claim 1 wherein said second amplitude of said second crossing point is greater than said first amplitude of said first crossing point when said DC offset voltage is greater than zero.

10. The differential clock receiver according to claim 1 wherein said second amplitude of said second crossing point is less than said first amplitude of said first crossing point when said DC offset voltage is less than zero.

11. The method according to claim 8 wherein the second amplitude of the second crossing point is greater than the first amplitude of the first crossing point when the DC offset voltage is greater than zero.

12. The method according to claim 8 wherein the second amplitude of the second crossing point is less than the first amplitude of the first crossing point when the DC offset is less than zero.

* * * * *